United States Patent
Ballandras et al.

(10) Patent No.: US 8,207,649 B2
(45) Date of Patent: Jun. 26, 2012

(54) SURFACE WAVE RESONATOR HAVING REDUCED PARASITIC RESONANCE

(75) Inventors: Sylvain Ballandras, Besancon (FR); Louis Penavaire, Nice (FR); Thomas Pastureaud, Biot (FR)

(73) Assignee: Senseor, Valbonne (FR)

(*) Notice: Subject to any disclaimer, the term of this patent is extended or adjusted under 35 U.S.C. 154(b) by 182 days.

(21) Appl. No.: 12/664,633

(22) PCT Filed: Jun. 18, 2008

(86) PCT No.: PCT/EP2008/057681
§ 371 (c)(1),
(2), (4) Date: Jun. 29, 2010

(87) PCT Pub. No.: WO2008/155346
PCT Pub. Date: Dec. 24, 2008

(65) Prior Publication Data
US 2010/0289380 A1    Nov. 18, 2010

(30) Foreign Application Priority Data
Jun. 19, 2007    (FR) ..................................... 07 04363

(51) Int. Cl.
*H01L 41/08* (2006.01)
(52) U.S. Cl. ................................ 310/313 D; 310/313 A
(58) Field of Classification Search .............. 310/313 R, 310/313 D
See application file for complete search history.

(56) References Cited

U.S. PATENT DOCUMENTS

| | | | |
|---|---|---|---|
| 6,278,219 B1 * | 8/2001 | Kaneda et al. | 310/313 D |
| 6,316,861 B1 | 11/2001 | Ballandras et al. | |
| 6,894,588 B2 * | 5/2005 | Detlefsen | 333/195 |
| 7,126,251 B2 | 10/2006 | Solal et al. | |
| 7,549,791 B2 | 6/2009 | Penavaire et al. | |
| 2002/0135270 A1 | 9/2002 | Ballandras et al. | |
| 2009/0085430 A1 * | 4/2009 | Andle et al. | 310/313 D |

FOREIGN PATENT DOCUMENTS

| | | |
|---|---|---|
| EP | 1 003 286 A | 5/2000 |
| FR | 2 864 618 A | 7/2005 |

OTHER PUBLICATIONS

U.S. Appl. No. 12/445,712, filed Oct. 17, 2007.

* cited by examiner

*Primary Examiner* — Marm Budd
(74) *Attorney, Agent, or Firm* — LaRiviere, Grubman & Payne, LLP

(57) ABSTRACT

The invention relates to a surface acoustic wave resonator produced on a cut substrate with propagation axes for which a nonzero directivity exists and comprising at least one central transducer (Tc) exhibiting a central axis, a first array of reflectors ($R_1$) and a second array of reflectors ($R_2$), said arrays being situated on either side of said transducer, characterized in that the two arrays of reflectors exhibit nonsymmetric configurations with respect to the central axis of said central transducer.
The introduction of an asymmetry makes it possible to strongly attenuate the parasitic resonances which may appear when the resonators are produced notably on piezoelectric substrates of quartz type or any other material and cut with propagation axes for which there exists a natural directivity ($LiTaO_3$, $LiNbO_3$, langasite, $GaPO_4$, $LiB_4O_7$, $KNbO_3$, etc.).

7 Claims, 5 Drawing Sheets and # SURFACE WAVE RESONATOR HAVING REDUCED PARASITIC RESONANCE

PRIORITY CLAIM

This application claims priority to PCT Application Number PCT/EP2008/057681, entitled Surface Wave Resonator Having Reduced Parasitic Resonance, filed on Jun. 18, 2008 and French Application Number 07 04363, entitled Surface Wave Resonator Having Reduced Parasitic Resonance, filed Jun. 19, 2007.

FIELD OF THE INVENTION

The invention pertains to an optimized surface wave resonator in which the parasitic resonances at the start and exit of the passband are strongly attenuated.

BACKGROUND OF THE INVENTION

In a general manner, surface wave components are generally well known and used in the field of signal processing, and mainly for band filtering, with possibilities of central frequency, of passband, of very diverse transfer functions.

To minimize the variations in the characteristics related to ambient temperature, to mechanical constraints, to pollution, as well as to variations in the chemical nature of the surface of the component, one seeks to produce components on substrates for which the variations in physical properties with temperature are as low as possible. Adhesives and supports of the substrate on which the component is produced which bring about the fewest possible constraints are used. Most of these components are encapsulated in hermetic packages, in a neutral atmosphere, so that no pollution can settle on the substrate and in particular on the wave excitation/detection electrodes, and that no chemical adulteration can occur.

On the other hand, the sensitivity of the speed of propagation of the surface waves to various exterior influences is a plus within the framework of sensor production. The possibility of thus using surface wave components was apparent practically right from the start of their use. But in recent years, several applications have begun to materialize. Today they are used both in temperature sensors and also in sensors of stress, pressure, torque or even of chemical quantities.

One of the foremost advantages of these sensors is that they can be interrogated remotely in a passive manner. In this case, the surface wave sensor is linked to an antenna which receives the interrogation signal. What is re-emitted by the antenna will therefore depend on the electrical reflection coefficient of the component $S_{11}$. In the case of more conventional applications where the component is used, for example in an oscillation loop, consideration is given rather to its electrical transfer function $S_{21}$. In the case of remote interrogation, the accessible characteristics are most frequently the delay of the interrogation signal introduced by the surface wave component or the central frequency of the component. Both the delay and the central frequency are directly related to the speed of propagation of the surface waves on the substrate. This speed is more or less sensitive to temperature, to the stresses applied to the substrate, to the materials deposited on the surface and also to their chemical nature according to the design of the corresponding sensor.

In the case where it were desired to determine the quantity to be measured by a frequency measurement, it would be necessary to choose a type of device whose central frequency can be determined accurately. Use is generally made of resonators which when they are designed in accordance with the rules of the art exhibit high Q factors, which are therefore suitable for accurate determination of the frequency. Moreover, resonators exhibit the advantage relative to other surface wave structures of having much smaller dimensions for identical performance. Thus, a 433-MHz resonator, produced on quartz, having a Q factor of 10 000 has a typical length of between 2.5 mm and 3 mm, whereas if it were desired to obtain the same band with a delay line, its length would be 15 times as large. Moreover, the possibility of being able to interrogate these components remotely, though it is an advantage, also imposes a few constraints in the case where the sensors were to be in electromagnetically non-enclosed environments since the emitted frequencies would then have to comply with the ISM (Industrial, Scientific and Medical) bands. It is noted that most of these ISM bands are narrow, thus constituting an additional reason for using resonators in preference to other types of surface wave components.

Surface wave resonators can a priori be produced on any type of piezoelectric substrate allowing the generation and propagation of surface waves, the most commonly used of these materials being quartz, lithium tantalate and lithium niobate. For each of these materials, several cuts are usable.

Quartz with various possible crystalline cuts is the most temperature stable of all these materials. The best known of these cuts are the Y cuts rotated about the X axis by an angle of between 32° and 42°45' (the ST cut); these cuts have a parabolic variation of frequency with temperature: (for example of the type, $f(T)-f(T_0))/f(T_0)=3\times10^{-8}\times(T-T_0)^2$, the factor $3\times10^{-8}$ possibly in fact being $4\times10^{-8}$ according to the adhesives used, the temperature $T_0$ depending on the angle of cut (being a reference temperature generally equal to 25° C.), on the working frequency as well as on the manufacturing parameters of the product. The material which exhibits the highest temperature coefficient is lithium niobate—Y cut and propagation along Z—for which the temperature coefficient is −90 ppm/° C. (lying between −80 and −100 ppm depending on chosen orientation). When it is required to comply with the ISM frequency bands, the only usable material is quartz so that the frequencies of the components used do not depart from the ISM bands under the usual temperature conditions of use (−20/+80° C.).

Moreover, when the quantities to be measured are other than temperatures (strains for example), the frequency variations versus temperature must preferably be lower than those induced by the quantity to be measured. It follows from this that here again quartz is often the only material usable for such applications.

It must also be noted that whatever the quantity to which access is desired, and whatever the material used, the resonant frequency of a resonator or the delay of a delay line are not only affected by the quantity to be measured. In general it is therefore necessary to arrange several resonators on the sensor or to embed several delays, so as to be able to establish the influence of each parameter. Thus, if it is desired to measure a pressure (through the strain which may result therefrom), it is necessary to be able to determine the temperature.

In the case of a temperature sensor, two resonators having different temperature behaviors have therefore to be arranged on the sensor, so as to eliminate the correlated frequency variations, related to other phenomena (frequency drift over time for example). To measure a pressure requires three resonators on the same substrate (therefore at the same temperature): just one of the three resonators is subjected to the strain resulting from the pressure to be measured, one of the other two resonators must have the same temperature behavior as that which measures the pressure, finally, the third resonator must have a different temperature behavior from that of the other two.

This configuration is also adopted for torque sensors as represented schematically in FIG. 1 and comprising three resonators each consisting of a transducer $T_1$, $T_2$, $T_3$ each lying between a pair of reflecting arrays $R_{11}$, $R_{12}$, $R_{21}$, $R_{22}$, $R_{31}$, $R_{32}$.

Thus, it readily becomes required to interrogate a set of three resonators whose resonant frequencies are not very different because of the limitations imposed by compliance with the ISM bands, but also for practical reasons (width of the frequency band to be scanned).

When it is required to design such resonators, a certain number of difficulties appear which make it necessary to address several constraints:

small bulk so as to obtain a component of small dimensions and therefore of low cost, impedance of each of the resonators matched to that of the antenna which picks up the interrogation signal so as to ensure the best possible effectiveness of the system, as high as possible a Q factor of the resonators, guaranteeing the best possible frequency resolution and therefore the sensitivity of the sensor, resonance of each of the resonators undisturbed by the other resonators. The latter constraint is not easy to comply with since the resonant frequencies are tightly spaced, and the surface wave resonators, through their design, exhibit impedance variations as a function of frequency other than those related to the desired resonance and which are liable to disturb the resonances of the neighboring resonators and thus falsify the frequencies measured as illustrated in FIG. 3.

At present, there exist numerous ways of designing surface wave resonators. There exist notably structures of a surface wave resonator of synchronous type or close to a synchronous type with 2 lines/λ (said to be asynchronous). In a resonator of synchronous type, reflectors and transducer consist of metallic lines or electrodes deposited on the substrate and which exhibit the same mechanical periodicity. In the structure there is no break in this periodicity. A cell can be defined as being the zone centered on the axis of a line and whose width is equal to the period of the reflectors and/or electrodes. In a synchronous resonator, all the cells (reflector type or transducer type) are adjoining. In a resonator said to be asynchronous, the periodicity $P_T$ of the electrodes of the transducer T is slightly different (lower) than that $P_R$ of the reflectors R, so as to obtain a resonant frequency centered in the stop band of the reflectors. However, all the cells are still adjoining. There is no separation (or offset) between the reflectors and the transducer (as illustrated in FIG. 2).

In all cases, one seeks to produce a resonant cavity for the surface waves, whose reflectors consist of arrays of metallized lines or ones that are etched in the substrate, these reflectors each having a low reflection coefficient (of the order of a % to a few 10% depending on the electrode configurations). At the frequency at which all the reflections are in phase (that is to say that for which the periodicity of the reflectors is equal to half a wavelength, also called the Bragg condition), the reflection coefficient is a maximum, and if the number of elementary reflectors is sufficiently large, this reflection coefficient is practically equal to 1.

The electrical coupling with the resonant cavity is achieved by placing one or two transducers in the resonant cavity. The transducers can have very different periods from those of the reflectors (3 lines or 4 lines per wavelength); they are then transparent in respect of the surface waves and their characteristics (number of electrodes, acoustic aperture) affect only the value of the resistance at resonance. On the other hand, they can also have an electrode periodicity equal or similar to that of the reflectors. In this case, the electrodes of the transducers participate in the total reflection coefficient, and this offers the advantage of being able to obtain a resonant cavity of better quality without having to increase the length of the reflectors.

In a general manner, the acoustic aperture of the transducer (the length of overlap between two fingers of opposite polarity) is advantageously arc-cosine weighted. This weighting of the electrode lengths is represented in FIG. 4. Indeed, if such a configuration is not complied with, the presence of several parasitic resonances due to transverse modes is noted. The presence of buses to which the fingers of the transducer are linked induces resonance conditions also depending on its acoustic aperture. If the aperture is constant along the length of the transducer, the synchronism conditions are all fulfilled for trapping the energy of these transverse modes which are neither more nor less than the multiple modalities of resonance and trapping of the Rayleigh wave. Their number and their amplitude depend on the thickness and on the degree of metallization as well as on the acoustic aperture. The weighting of the aperture of the transducer in accordance with an arc-cosine law ensures good coupling with the first mode (the principal resonance), but is detrimental to that of the higher-order transverse modes.

In parallel with the use of the cuts of mono-crystalline piezoelectric materials (generally of quartz with an ST cut or a cut similar to this), and with a propagation axis (the X axis for ST quartz) for which the directivity is zero, the development of sensor applications utilizing surface wave resonators has spurred the use of propagation axes other than the X axis on the usual quartz cuts, for which axes the directivity is not zero. However, the use of these cuts exhibiting nonzero directivities can lead to the appearance of parasitic resonances which are penalizing for many sensor applications utilizing surface wave resonators since they interfere with the principal resonance of one of the other resonators required for the operation of the sensor.

SUMMARY OF THE INVENTION

This is why in order to solve this problem of parasitic resonance, the present invention relates to a novel type of surface wave resonator on quartz or any other material and cut exhibiting a natural directivity ($LiTaO_3$, $LiNbO_3$, langasite, $GaPO_4$, $LiB_4O_7$, $KNbO_3$, AlN, GaN, ZnO, these last three materials often being utilized in the form of thin films, etc.), in which the parasitic resonance at the start or exit of the stop band, in addition to the desired resonance, is strongly attenuated and notably when such a resonator is produced for example on quartz cuts with propagation axes for which a natural directivity exists. More precisely, the subject of the present invention is a surface acoustic wave resonator produced on a cut substrate with propagation axes for which a nonzero directivity exists and comprising at least one central transducer exhibiting a central axis, a first array of reflectors and a second array of reflectors, said arrays being situated on either side of said transducer, characterized in that the two arrays of reflectors exhibit non-symmetric configurations with respect to the central axis of said central transducer, the first and/or the second arrays of reflectors exhibiting over a portion of reflector units, a variation in periods of said reflectors.

According to a variant of the invention, the first array of reflectors exhibiting a first separation distance with respect to the transducer, the second array of reflectors exhibiting a second separation distance with respect to the transducer, the first and second separation distances corresponding respectively to the distance between an end of the first array of reflectors and a first end of the transducer and to the distance separating an end of the second array of reflectors and the second end of the transducer, said separation distances are different.

According to a variant of the invention, the first and/or the second array of reflectors comprise around one hundred (this is an order of magnitude, but it may be several hundred) reflectors and exhibit, on about ten to around twenty reflector units, a variation in periods of said reflectors.

Advantageously, the variation in period is about 1%. This variation makes it possible to avoid overly fierce variations in the period (which could be harmful to the proper operation of the resonator). The amplitude of the array-transducer separation, required in order to attenuate the parasitic resonance, is advantageously distributed over the chosen number of reflectors.

According to a variant of the invention, the period of the reflecting arrays being of the order of 3.5 microns (for an application at 433 MHz only), the variation in period with respect to said period is a few tens of nanometers.

According to a variant of the invention, the reflectors consisting of metallic lines, the first series and/or the second series of reflectors exhibit, on a portion of reflector units, a variation in thickness of said lines.

According to a variant of the invention, the reflectors consisting of metallic lines, the first series and/or the second series of reflectors exhibit, on a portion of reflector units, a variation in the nature of the metal.

According to a variant of the invention, the reflectors consisting of passivated metallic lines (that is to say covered with a dielectric layer, such as for example silica $SiO_2$, silicon oxy-nitrides, titanium oxide $TiO_2$, etc.) for pollution immunity reasons mentioned in the introduction, the passivation thickness varies along the array of reflectors or the passivation may optionally change nature.

The invention will be better understood and other advantages will become apparent on reading the description which follows given without limitation and by virtue of the appended figures among which:

LIST OF THE DRAWINGS

Figure 7A:
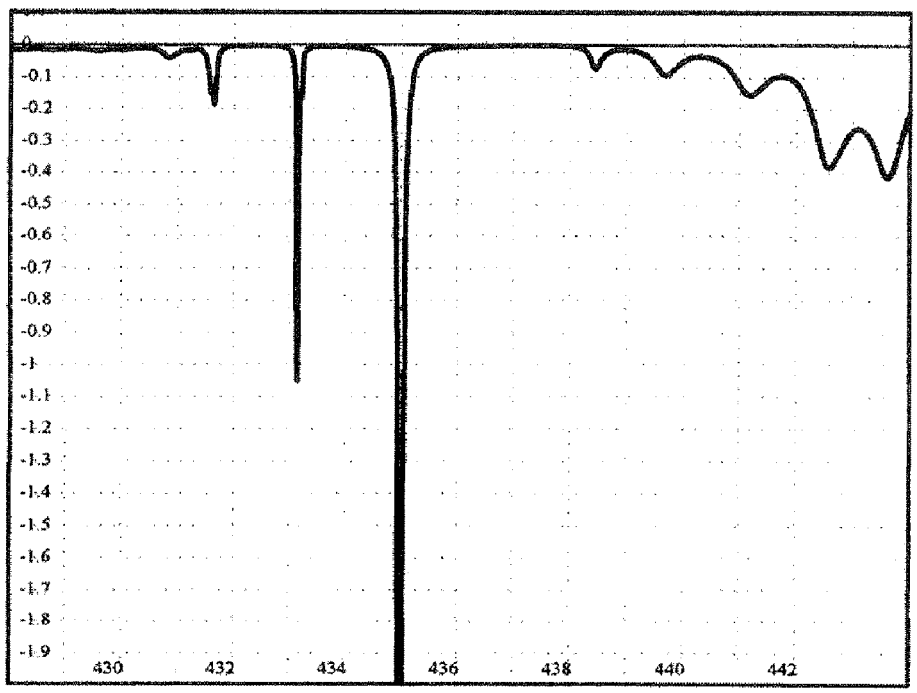
Figure 7B:
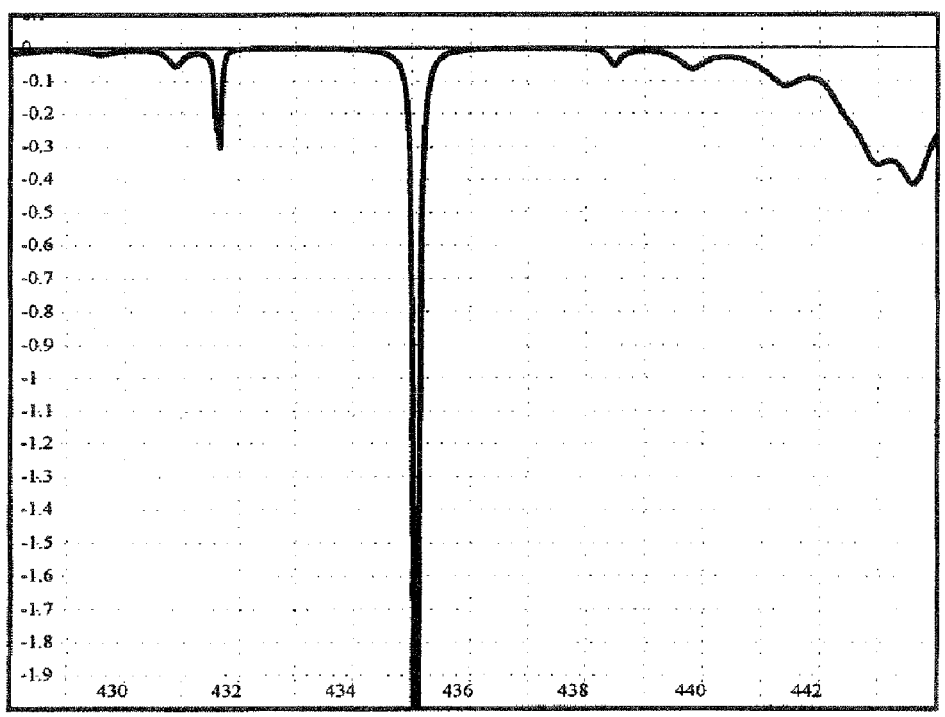
Figure 7C:
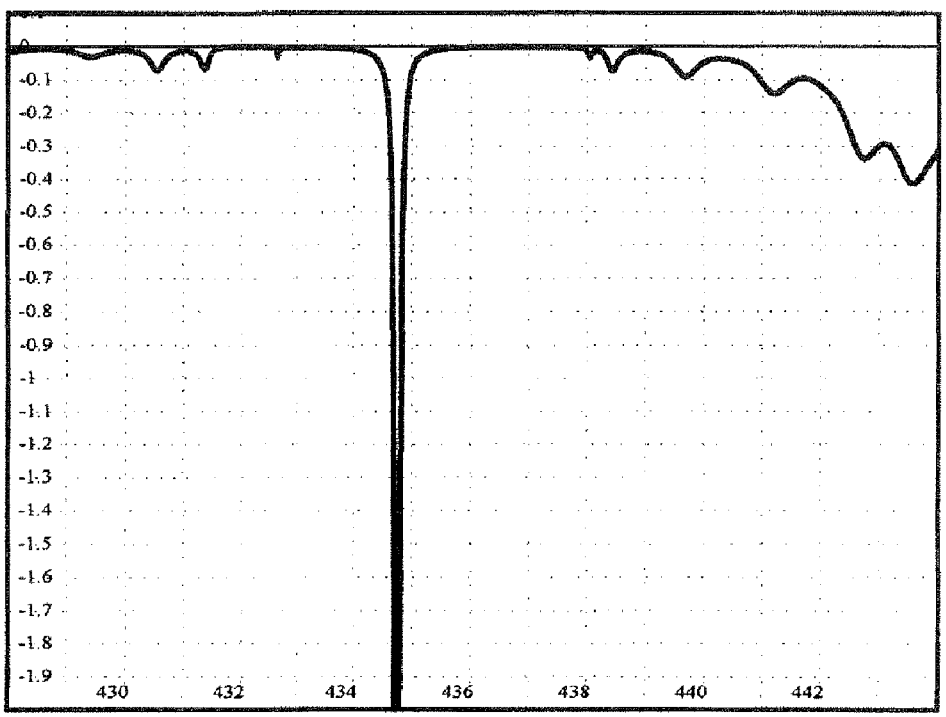

FIGS. 7a, 7b and 7c illustrate the resonance spectra (the modulus of the reflection coefficient of the device $S_{11}$) respectively for an exemplary resonator based on quartz with a Y+34° cut, propagation on X+30°, respectively, with a symmetry of the reflecting arrays with respect to the central axis $A_T$, with offsets on either side of the transducer, with a single offset of one of the reflecting arrays with respect to the transducer.

DETAILED DESCRIPTION OF THE INVENTION

In a general manner, the resonator of the invention comprises at least one central transducer and two arrays of reflectors on either side of said transducer. The transducer and the reflecting arrays are typically produced by depositions of metallic lines on a piezoelectric substrate.

According to the invention, a progressive and gentle dissymmetry is introduced at the level of the reflectors on either side of the central transducer so as to minimize the losses.

Figure 1:
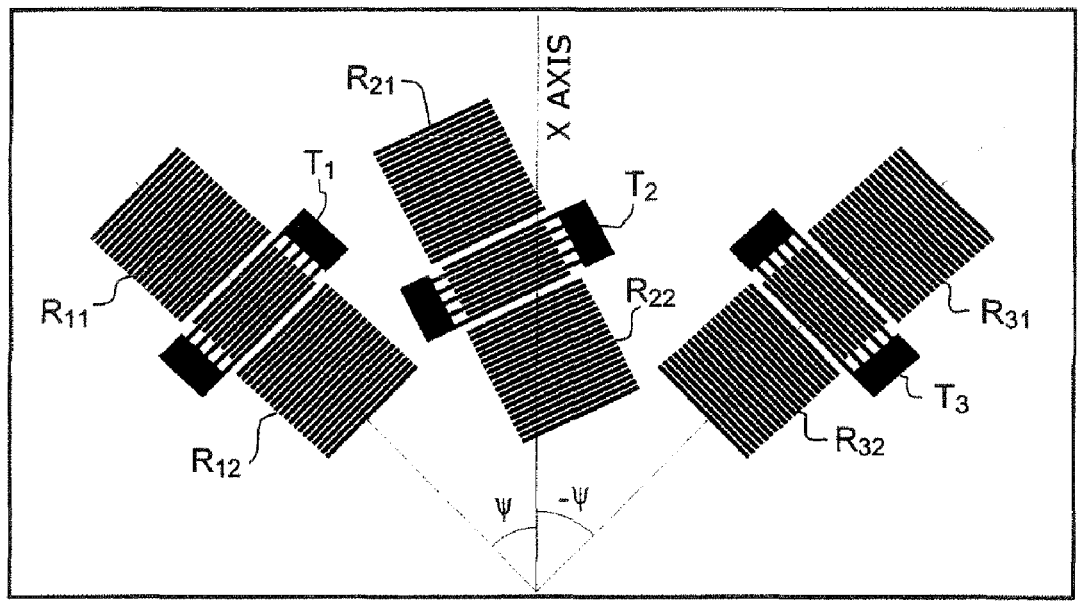
FIG. 1 illustrates a torque sensor according to the known art comprising three resonators.
Figure 2:
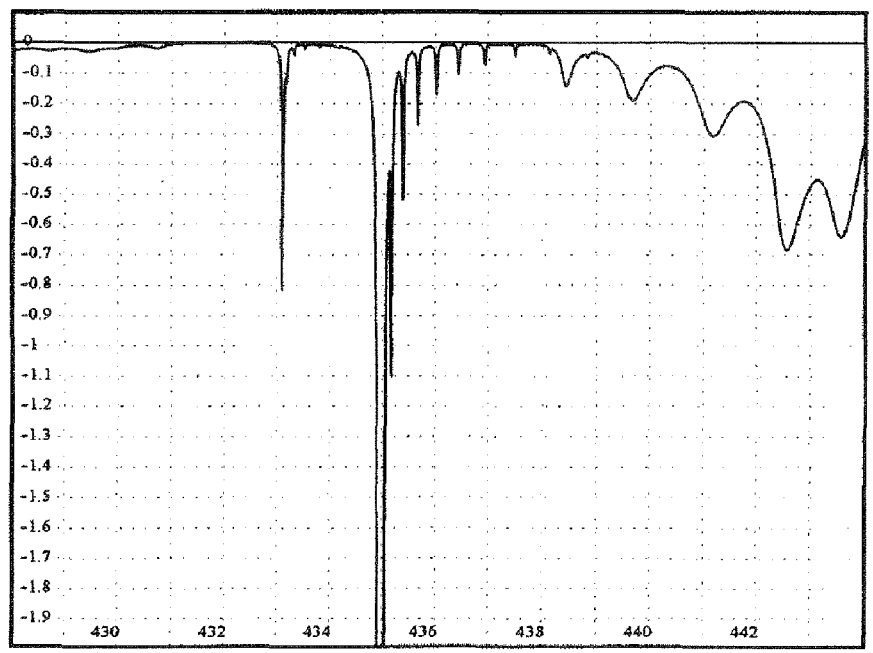
FIG. 2 illustrates the evolution of the reflection coefficient for a quartz-based resonator as a function of frequency and exhibiting undesirable secondary resonances.
Figure 3:
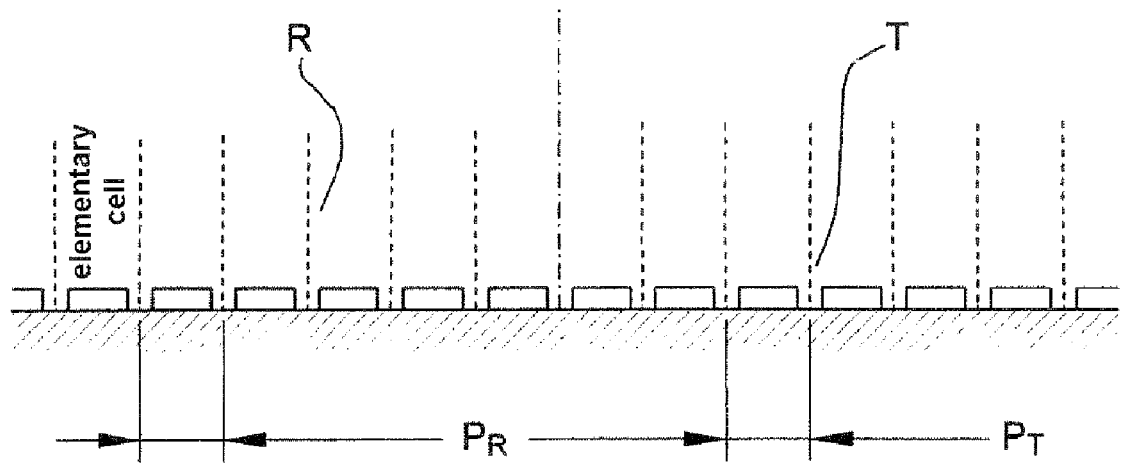
FIG. 3 illustrates an exemplary resonator structure in which the array of reflectors and the transducer are adjoining.
Figure 4:
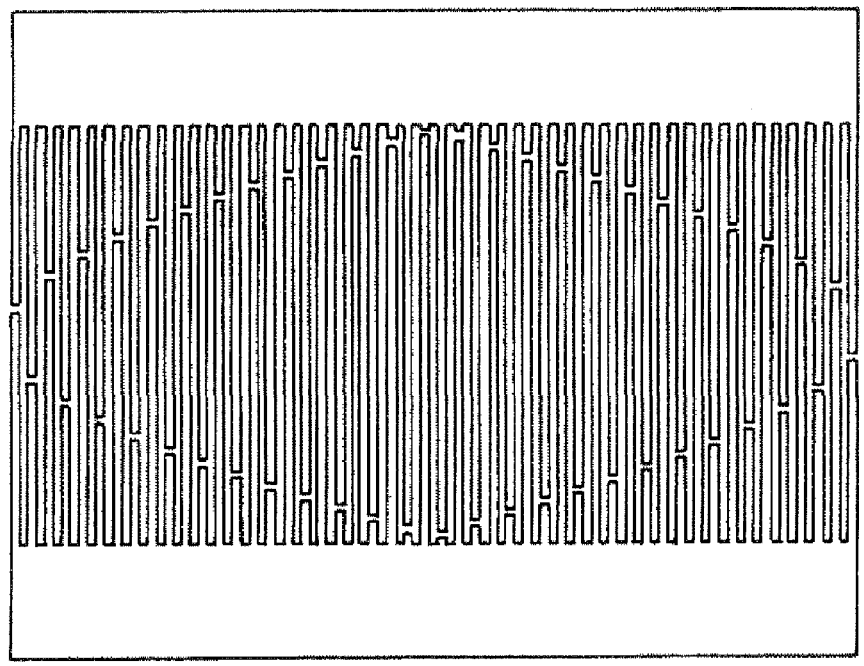
FIG. 4 illustrates the acoustic aperture of an exemplary arc-cosine weighted transducer.
Figure 5A:
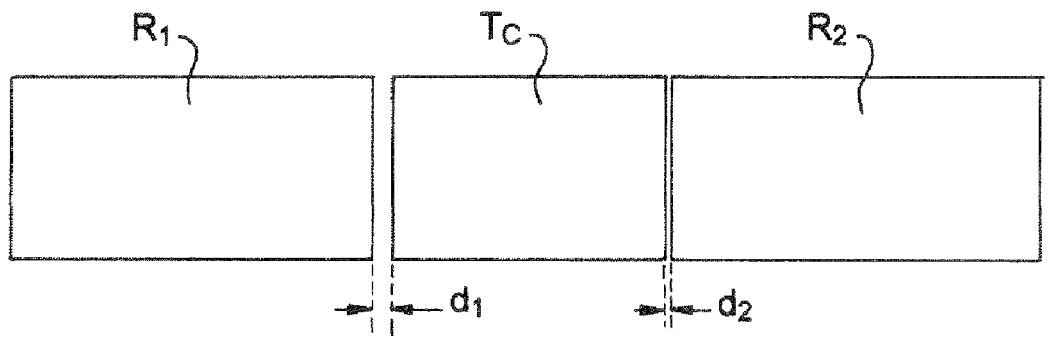
FIGS. 5a and 5b illustrate a first exemplary resonator according to the invention comprising a distance offset of the series of reflecting arrays on either side of the central transducer.
Figure 5B:
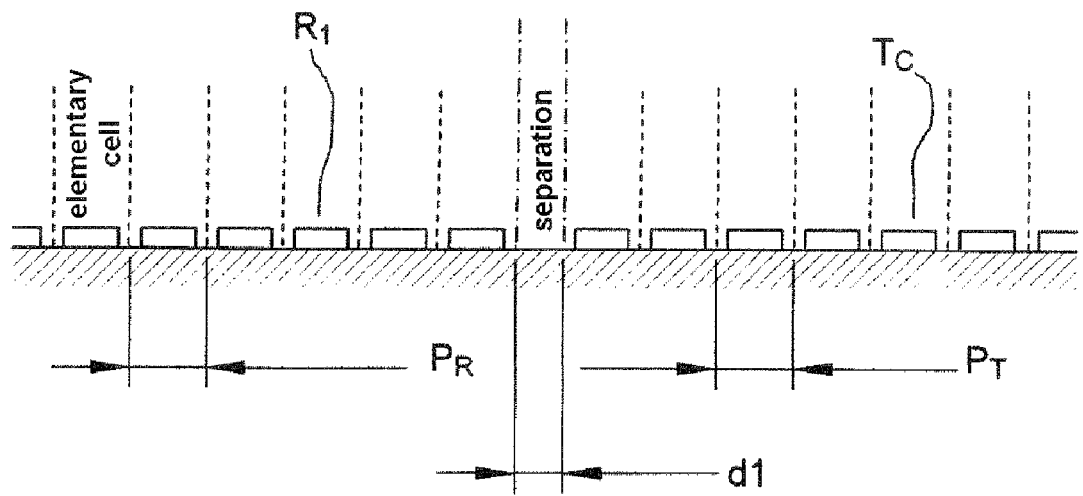

According to a first variant of the invention illustrated in FIGS. 5a and 5b, offsets are introduced between the transducer $T_c$ and the two reflecting arrays $R_1$ and $R_2$). The distance between the cell corresponding to a reflector, the rightmost cell of the left reflecting array and the leftmost cell of the transducer is $d_1$. The distance between the rightmost cell of the transducer and the leftmost cell of the right reflecting array is $d_2$. In the case of zero directivity, it is necessary to have $d_1=d_2=0$. Typically the distances $d_1$ and $d_2$ separating the reflecting arrays $R_1$ and $R_2$ of the transducer are less than half a wavelength and therefore have different values on one side or on the other of the transducer and depend on the value of the directivity.

Thus, to avoid the presence of undesirable modes at the start or at the end of the stop band (depending on the chosen configuration), a variant of the invention consists in introducing separations between each of the arrays and the transducer, these separations being d1 and d2

$$d_1=\lambda_0\times(\delta/2/360)$$

and that on the other side being $d_2$ with:

$$d_2=\lambda_0\times[(180-\delta/2)/360]$$

For example, for a wavelength of 7.5 μm and a directivity of 50°, we obtain:

$d_1=0.52$ μm
$d_2=3.23$ μm
δ being the directivity in degrees (positive or negative value) depending on the
material cut considered and on the configuration of the electrodes.

The directivity δ must therefore be determined for this purpose.

Figure 6:
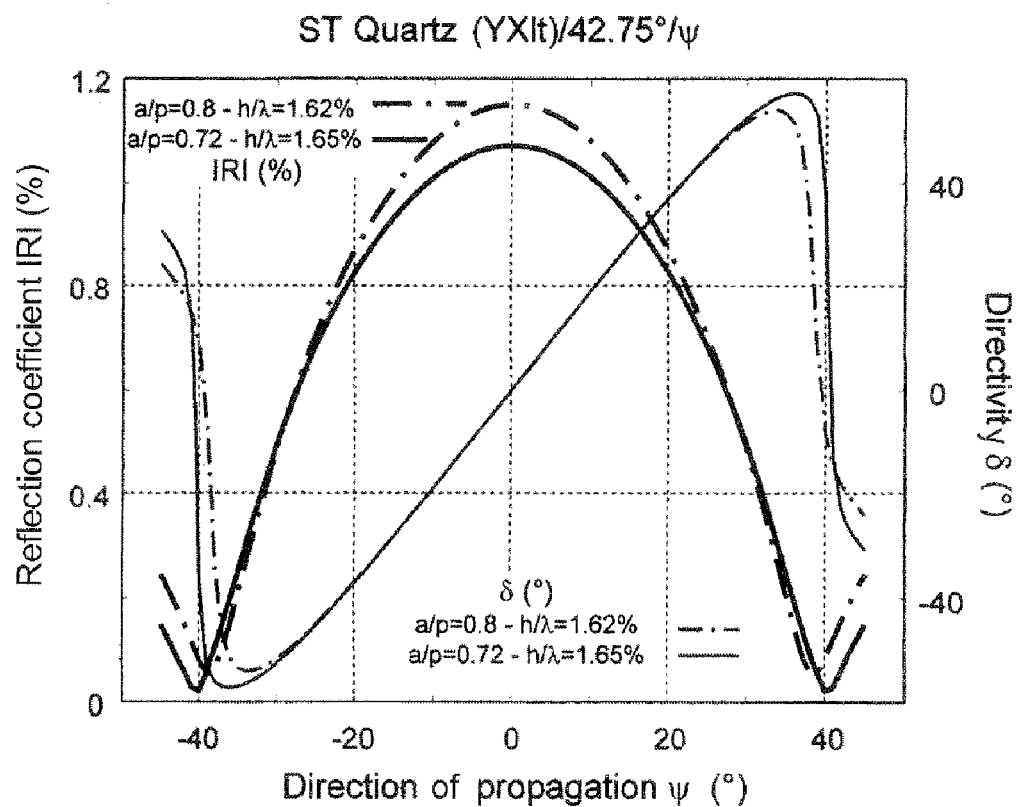
FIG. 6 illustrates an exemplary evolution of the reflection coefficient and of the directivity as a function of direction of propagation in a resonator according to the invention.

To determine the directivity δ, it is necessary to use a model affording access to the wave propagation characteristics under an array of electrodes, the harmonic and periodic so-called FEM/BEM model making it possible to estimate the properties of the waves of Rayleigh type under such conditions (this model makes it possible to characterize the properties of any type of guided wave). It is assumed that the transducer is periodic and the properties of the acoustic wave which propagates under the array of electrodes are characterized. The model being periodic, the material and its orientation are fixed, and the properties of the wave then depend only on two independent geometric parameters:

the degree of metallization, that is to say, the ratio of the width a of the electrode to the period p of the array (ratio a/p);

the relative metallization height, that is to say, the height of the electrode normalized by the period or a multiple of the period as a function of the electrical excitation imposed;

the shape of the electrode, although apt to condition the wave reflection characteristics, is often idealized as a rectangle shape (modification of the properties of the waves of a few %);

By taking account of the following parameters:
type of the piezoelectric substrate,
angle of cut θ,
direction of propagation ψ,
degree of metallization a/p,
height of metallization h/λ, it is possible to determine the reflection coefficient and the directivity, as a function of direction of propagation as illustrated in FIG. 6.

By way of validation, FIGS. 7a, 7b and 7c illustrate the resonance spectra for an exemplary resonator based on quartz with a Y+34° cut, propagation on X+30°, respectively with a symmetry of the reflecting arrays with respect to the central axis $A_T$, with offsets on either side of the transducer and with a single offset.

According to a variant of the invention, the resonator comprises two arrays of reflectors comprising locally a variation in period of the reflectors over a few units. Thus locally the periods $P_{r1}$ and/or $P_{r2}$ are locally modified. If locally the period is increased, this amounts to having a positive offset. If the inverse is true, the offset is negative.

Typically for a resonator operating at 433 MHz, when the period is of the order of 3.5 microns for reflecting arrays comprising about a hundred metallic lines, the period on around ten lines can be modified, doing so with a variation of a few tens of nanometers. The period of the transducer differs from that of the arrays by a few tens of nanometers also (of the order of 1% of the period).

According to a variant of the invention, the reflectors consisting of metallic lines, the first series and/or the second series of reflectors exhibits over a portion of reflector units, a variation in thickness of said lines. Typically reference may be made to FIG. 6, showing the variation in directivity induced by a relative thickness variation of 0.03% for the directions of propagation lying between ±30 and ±40°.

According to a variant of the invention, the resonator comprises two arrays of reflectors consisting of metallic lines. At least one of the two arrays comprises locally a few reflectors produced with a different metal. Typically when all the reflectors are made of aluminum, the few electrodes involved in modifying the parasitic resonance can be made for example of aluminum with a light doping of copper, this doping being apt to modify the reflectivity properties depending on how significant it is. Copper can also be used, the density being substantially higher in this case. An additional metal film (Cr, Au, Ti, Pt, etc.) can also be deposited on certain electrodes, appreciably varying the reflectivity without overly affecting the propagation speed or the acoustic losses. The metal and its thickness are chosen so as to obtain a discernible modification of the directivity without overly affecting the speed of the mode with respect to the remainder of the array).

An alternative to this variant resides in the possibility of locally varying the passivation of a few units of reflecting lines within at least one of the two reflecting arrays, the passivation operation being a conventional final protection operation for surface wave components.

What is claimed is:

1. A surface acoustic wave resonator produced on a cut substrate with propagation axes for which a nonzero directivity exists and comprising at least one central transducer (Tc) exhibiting a central axis, a first array of reflectors ($R_1$) and a second array of reflectors ($R_2$), said arrays being situated on either side of said transducer, wherein the two arrays of reflectors exhibit nonsymmetric configurations with respect to the central axis of said central transducer, the first and/or the second arrays of reflectors exhibiting over a portion of reflector units, a variation in periods of said reflectors.

2. The surface acoustic wave resonator as claimed in claim 1, wherein the first array of reflectors exhibiting a first separation distance ($d_1$) with respect to the transducer, the second array of reflectors exhibiting a second separation distance ($d_2$) with respect to the transducer, the first and second separation distances corresponding respectively to the distance between an end of the first array of reflectors and a first end of the transducer and to the distance separating an end of the second array of reflectors and the second end of the transducer, said separation distances being different.

3. The surface acoustic wave resonator as claimed in one of claim 1 or 2, wherein the first and/or the second array of reflectors comprise around one hundred to several hundred reflectors and exhibit, on about a tenth of reflector units, a variation in periods of said reflectors.

4. The surface wave resonator as claimed in one of claims 1 to 2, wherein the variation in period with respect to the period of the arrays of reflectors is of the order of a few per thousand.

5. The surface acoustic wave resonator as claimed in one of claims 1 to 2, the reflectors consisting of metallic lines, the first series and/or the second series of reflectors exhibit, on a portion of reflector units, a variation in thickness of said lines.

6. The surface acoustic wave resonator as claimed in one of claims 1 to 2, the reflectors consisting of metallic lines, the first series and/or the second series of reflectors exhibit, on a portion of reflector units, a variation in the nature of the metal.

7. The surface acoustic wave resonator as claimed in one of claims 1, wherein the reflectors consisting of metallic lines covered with a passivation layer, the first array and/or the second array of reflectors exhibit, on a portion of reflector units, a variation in the thickness of said passivation layer or a variation in the nature of the passivation.

* * * * *